United States Patent
Avanzino et al.

(10) Patent No.: US 6,593,632 B1
(45) Date of Patent: Jul. 15, 2003

(54) INTERCONNECT METHODOLOGY EMPLOYING A LOW DIELECTRIC CONSTANT ETCH STOP LAYER

(75) Inventors: Steven C. Avanzino, Cupertino, CA (US); Minh Van Ngo, Fremont, CA (US); Angela T. Hui, Fremont, CA (US); Chun Jiang, San Jose, CA (US); Hamid Partovi, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 84 days.

(21) Appl. No.: 09/375,500

(22) Filed: Aug. 17, 1999

(51) Int. Cl.[7] .......................... H01L 29/76; H01L 29/94
(52) U.S. Cl. ...................... 257/382; 257/383
(58) Field of Search ................ 257/758, 773, 257/774, 903, 904, 905, 401, 408, 412, 382, 383; 438/300

(56) References Cited

U.S. PATENT DOCUMENTS

| | | | | |
|---|---|---|---|---|
| 5,240,871 A | * | 8/1993 | Doan et al. | 438/397 |
| 5,381,046 A | * | 1/1995 | Cederbaum et al. | 257/904 |

* cited by examiner

*Primary Examiner*—Tom Thomas
*Assistant Examiner*—Hung Kim Vu

(57) ABSTRACT

The capacitance between the gate of a transistor and local interconnect is reduced employing SiC as an etch stop layer. Embodiments include depositing a SiC etch stop layer having a thickness of about 500–1000 Å and a dielectric constant of less than about 3.2, thereby providing a composite dielectric constant between the gate and local interconnect of between about 3.7 to about 4.7. The SiC etch stop layer can be deposited by PECVD or HDP techniques.

7 Claims, 3 Drawing Sheets

INTERCONNECT METHODOLOGY EMPLOYING A LOW DIELECTRIC CONSTANT ETCH STOP LAYER

RELATED PATENT APPLICATION

This patent application contains subject matter related to subject matter disclosed in U.S. patent application Ser. No. 09/375,499, filed on Aug. 17, 1999, now U.S. Pat. No. 6,137,126, entitled "METHOD TO REDUCE GATE-TO-LOCAL INTERCONNECT CAPACITANCE USING A LOW DIELECTRIC CONSTANT MATERIAL FOR LDD SPACER", the entire disclosure of which is incorporated herein by reference.

TECHNICAL FIELD

The present invention relates to semiconductor devices and manufacturing processes, and more particularly to methods for providing improved structures in which gate-to-local interconnect capacitance is reduced by utilization of a low dielectric constant material for a local interconnect etch stop layer, namely silicon carbide ("SiC").

BACKGROUND

Integrated circuit designs have numerous active devices such as transistors laid out on a common substrate, typically silicon. A continuing trend in semiconductor technology is to build integrated circuits with more and/or faster semiconductor devices. The drive toward this ultra large-scale integration (ULSI) has resulted in continued shrinking of active devices and circuit features.

In order to achieve higher device density, smaller geometry devices have been developed. Isolation regions separate the active devices to prevent electrical interference between them. Such isolation regions may be formed early in the fabrication process by masking the intended active regions and growing an insulator, such as an oxide, in the non-masked isolation regions. The grown oxide, referred to as a field oxide, serves to isolate and define the active regions. The active devices are formed by various processing steps and then covered with an insulator.

In order to interconnect the various active devices, one or more overlying metalization layers are formed on top of the insulator with connections to the devices provided by conductively filled openings in the insulator. The various devices are thereby interconnected between adjacent active devices that may be disposed underneath the insulating layer. Such an interconnection, known as a local interconnect ("LI"), is formed on top of the isolating field oxide and prior to forming overlying insulating and metalization layers.

A local interconnect formed between two active regions will typically connect a source/drain region of one active region to the source/drain region of the other. However, local interconnects may also be formed between polysilicon gate regions and between a polysilicon gate region and source/drain region. In general, local interconnects are used to connect electrodes of active devices within an integrated circuit to provide an electrical connection between two or more conducting or semi-conducting regions (e.g., active regions of one or more devices). For example, a plurality of transistors can be connected to form an inverting logic circuit using a local interconnect.

Local interconnects typically comprise a relatively low-resistance material, such as a conductor or doped semiconductor, that is formed to electrically couple the selected regions. For example, in certain arrangements, damascene techniques are used to provide local interconnects made of tungsten (W), titanium/titanium nitride or a like conductor metal, which is deposited within an etched opening, such as a via or trench that connects the selected regions together. The use of local interconnects reduces the coupling burden on the subsequently formed higher layers to provide such connectivity, which reduces the overall circuit size and as such tends to increase the circuit's performance.

As circuit density increases, the demand for more efficient, effective and precise processes for forming smaller local interconnects increases and, as devices scale, the increased capacitance between gate/poly (gate/polysilicon) features and tungsten or copper damascene local interconnect features becomes significant. These narrow spaces are frequently filled with a high dielectric constant material, such as SiN or SiON. As such, it has been found difficult to provide low RC (resistance capacitance) interconnection patterns, particularly where sub-micron via contacts and trenches have high aspect ratios imposed by miniaturization. Accordingly, there is need to reduce the composite dielectric constant of the materials between polysilicon/Local Interconnect ("poly-LI").

The small spaces between gate and LI are typically filled with a dielectric material such as SiON or SiN having a dielectric constant K of about 5 to about 7. SiN or SiON is used as an LI etch stop layer to protect the field oxide and poly during LI etch. It would be advantageous if the composite K between gate-LI is lowered to a range of about 3 to about 5.5, preferably about 3.7 to about 4.7. Lower-K materials provide less capacitance, increasing the propagation speed of electrical signals. Thus, the use of lower K materials would provide a semiconductor chip with an overall lower RC delay and an improved operating speed relative to prior designs.

SUMMARY OF THE INVENTION

The above and other needs are met by the present invention which provides methods for substantially reducing the composite K of the materials between poly-LI. In an embodiment, the method includes:

forming a field dielectric region on a substrate isolating an active region;

forming a first transistor in the active region, the transistor comprising a first gate electrode over the substrate with a gate dielectric layer therebetween and source/drain regions in the substrate on opposite sides of a channel region under the gate electrode;

forming a second transistor having a second gate electrode extending on the field dielectric region;

depositing a conformal layer comprising silicon carbide (SiC) over the first and second gate electrodes, substrate surface and field dielectric region;

depositing an inter-dielectric layer (a.k.a. inter-layer dielectric) over the SiC layer;

etching an opening through the inter-dielectric layer stopping on and exposing a portion of the SiC layer;

etching the exposed portions of the SiC layer to extend the opening and to expose a portion of the source/drain region of the first transistor, the second gate electrode and the field dielectric region; and filling the extended opening with a conductive material to form a local interconnect between the exposed source/drain region and the second gate electrode.

Embodiments include depositing a dielectric layer of silicon carbide ("SiC") by Plasma Enhanced Chemical Vapor Deposition (PECVD) or High-Density Plasma (HDP) techniques as an etch stop layer in place of SiN or SiON. The inter-dielectric layer may comprise any suitable dielectric material, such as a TEOS oxide.

Another aspect of the present invention is a semiconductor device comprising a SiC dielectric stop layer, which semiconductor device can be made according to the above methods. In particular, the semiconductor wafer or device comprises:

a substrate having a main surface;

a field dielectric region isolating an active region;

a transistor formed in the active region, the transistor comprising:
  a first gate electrode on the main surface of the substrate with a gate dielectric layer therebetween; and
  source/drain regions in the substrate with a channel region therebetween underlying the gate electrode;

a second gate electrode extending on the field dielectric region;

a conformal layer of silicon carbide (SiC) over the transistor, second gate electrode and field dielectric region;

an inter-dielectric layer on the SiC layer;

an opening formed in the inter-dielectric layer and SiC layer exposing a portion of a source/drain region, field oxide region and second transistor; and conductive material filling the opening and forming a local interconnect between the source/drain region of the transistor and second gate electrode.

The foregoing and other features, aspects and advantages of the present invention will become more apparent to the skilled artisan from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

The figures representing cross-sections of portions of an integrated circuit device during fabrication are not drawn to scale, but instead are drawn to illustrate the features of the present invention.

DETAILED DESCRIPTION OF PREFERRED EMBODIMENTS

It will be appreciated that the process steps and structures described below do not form a complete process flow for manufacturing integrated circuits. Moreover, the present invention can be practiced utilizing conventional integrated circuit fabrication techniques, and so much of the commonly practiced process steps are included as are necessary for an understanding of the present invention.

Figure 1:
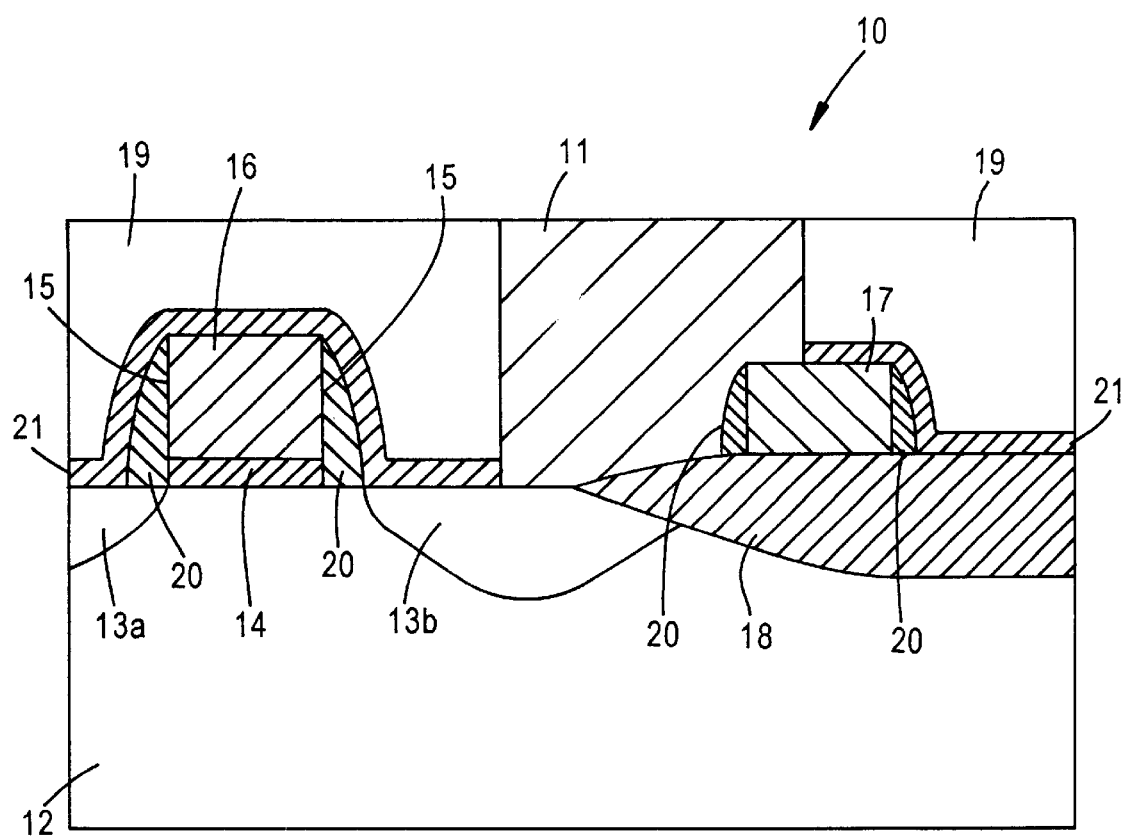
FIG. 1 depicts a cross-section of a portion of a semiconductor wafer having a stop layer made of SiC and a dielectric layer as prepared for local interconnect processing using conventional deposition processes.

FIG. 1 depicts a cross-section of a portion 10 of a semiconductor wafer in accordance with an embodiment of the present invention having an etch stop layer 21 and a dielectric layer 19. Portion 10 includes a substrate 12 in which first transistor 19 is formed comprising first gate electrode 16. A second transistor is formed comprising second gate electrode 17 extending on field dielectric 18. First transistor 19 further comprises source/drain regions 13a, 13b in substrate 12 and gate oxide 14, e.g., silicon dioxide ($SiO_2$), underlying gate electrode 16. Dielectric sidewall spacers 20 are formed on side surfaces 15 of gate electrode 16.

Embodiments of the present invention depart from conventional practices by forming etch stop layer 21 of SiC rather than a high dielectric constant material such as silicon nitride (e.g., $Si_3N_4$) or silicon oxynitride (SiON). Inter-dielectric layer 19 is then deposited over etch stop layer 21.

The SiC stop layer can be deposited from Si and C source gases, such as $SiH_4$ and $CH_4$, using plasma conditions attainable in conventional PECVD or HDP reactors. The dielectric constant of the deposited SiC is less than about 3.2. The SiC stop layer is deposited at an appropriate thickness which can range from about 500 Å to about 1000 Å, e.g., about 800 Å.

Etch stop layer 21 provides process control in forming local interconnect 11. For example, if dielectric layer 19 is a TEOS oxide layer and stop layer 21 is a SiC layer, then a subsequent oxide etching process that exhibits a high selectivity to SiC can be used to remove selected portions of dielectric layer 19. For example, an octaflourobutene ($C_4F_8$) based plasma has a high etch rate for TEOS oxide but a low etch rate for SiC. Other etch chemistries include, without limitation, $C_5F_8$, $C_2F_6$.

Stop layer 21 may be deposited in the same deposition apparatus as dielectric layer 19, thereby advantageously eliminating the need to relocate or otherwise move the semiconductor wafer between different process tools to reduce the process cycle times and increase throughput. In addition, defects such as the outgassing defects that typically form between the stop layer and dielectric layer in conventional separate deposition processes, are avoided or substantially eliminated. During deposition, the temperature within a conventional reaction chamber may be monitored and controlled as, for example, by using a conventional temperature controller, to improve process control, e.g., the AMAT 5000 available from Applied Materials, Inc. of Santa Clara, Calif. The deposition process may be carried out a temperature of less than about 400° C. to about 480° C.

Substrate 12 can include a heavily-doped silicon substrate layer that is approximately 2 mm thick and on which there is grown a lightly-doped epitaxial (epi) layer that is approximately 4 μm thick. Gate oxide layer 14 can be approximately 55 Å thick, and gates 16 and 17, e.g., polycrystalline silicon approximately 1,700 Å thick. SiC stop layer 21 can be about 800 Å thick. Dielectric layer 19 can be a layer of TEOS oxide about 12,000 Å thick. In a subsequent step, the exposed top surface of dielectric layer 19 can be planarized down, for example, using an oxide CMP process, to a thickness of approximately 6500 to 9500 Å.

Figure 2A:
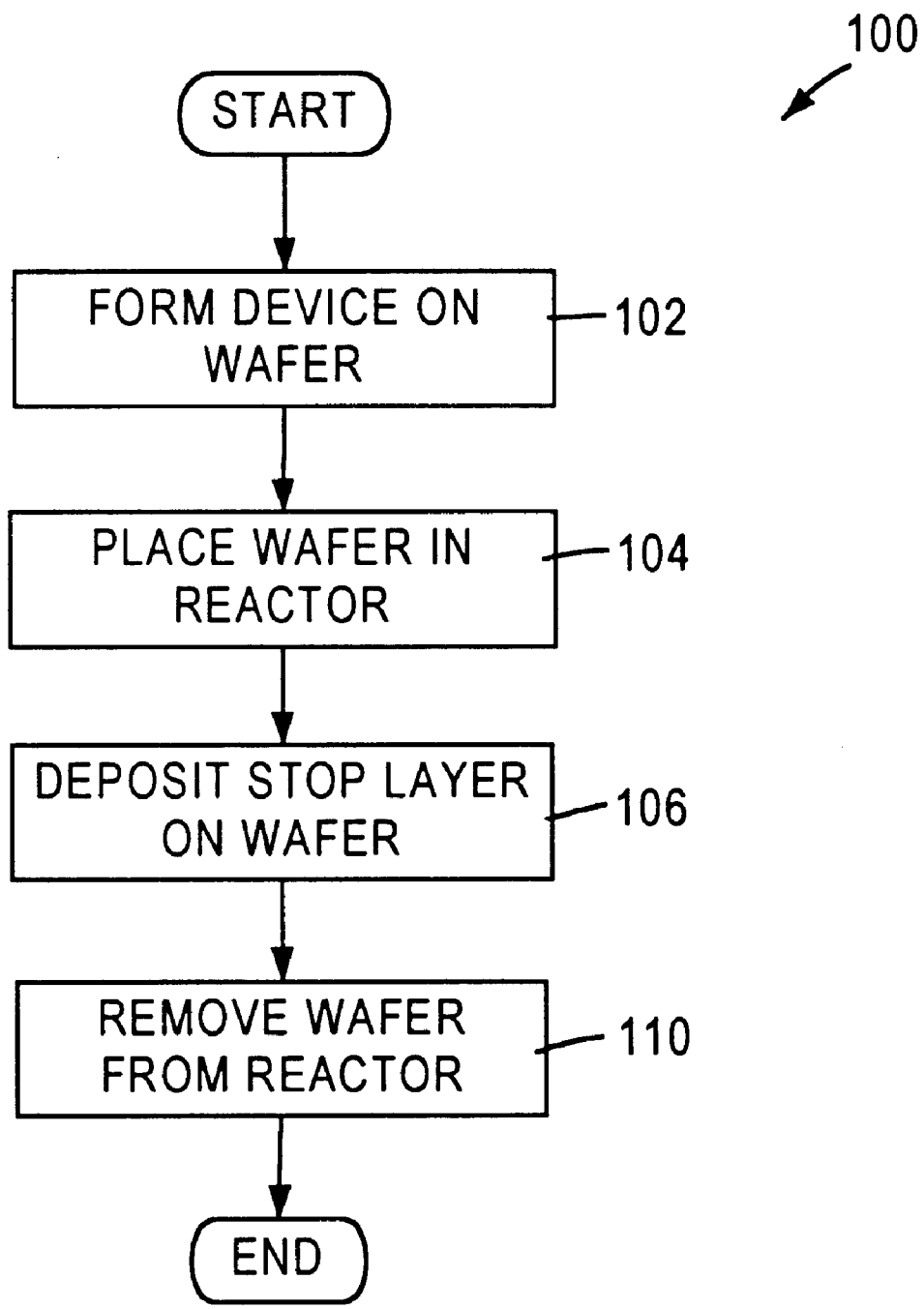
FIG. 2a depicts a flow-chart of a method for depositing a stop layer, in accordance with one embodiment of the present invention.

FIG. 2a depicts a flow chart of a method 100 for forming a stop layer 21 in accordance with an embodiment of the present invention. Method 100 includes forming devices on a semiconductor wafer, in step 102, using conventional semiconductor device fabrication processes. By way of example, portion 10 of FIG. 1 without stop layer 21 and dielectric layer 19 represents an exemplary wafer having such devices. In step 104, the wafer is placed in a CVD or a like deposition system. Next, in step 106, a stop layer 21 comprising SiC, is deposited on the wafer and the temperature is maintained at approximately 380° C. to 480° C. (or higher). By way of example, SiC is formed in a PECVD system using silane ($SiH_4$), and $CH_4$. Then in step 110, the wafer is removed from the reactor.

Figure 2B:
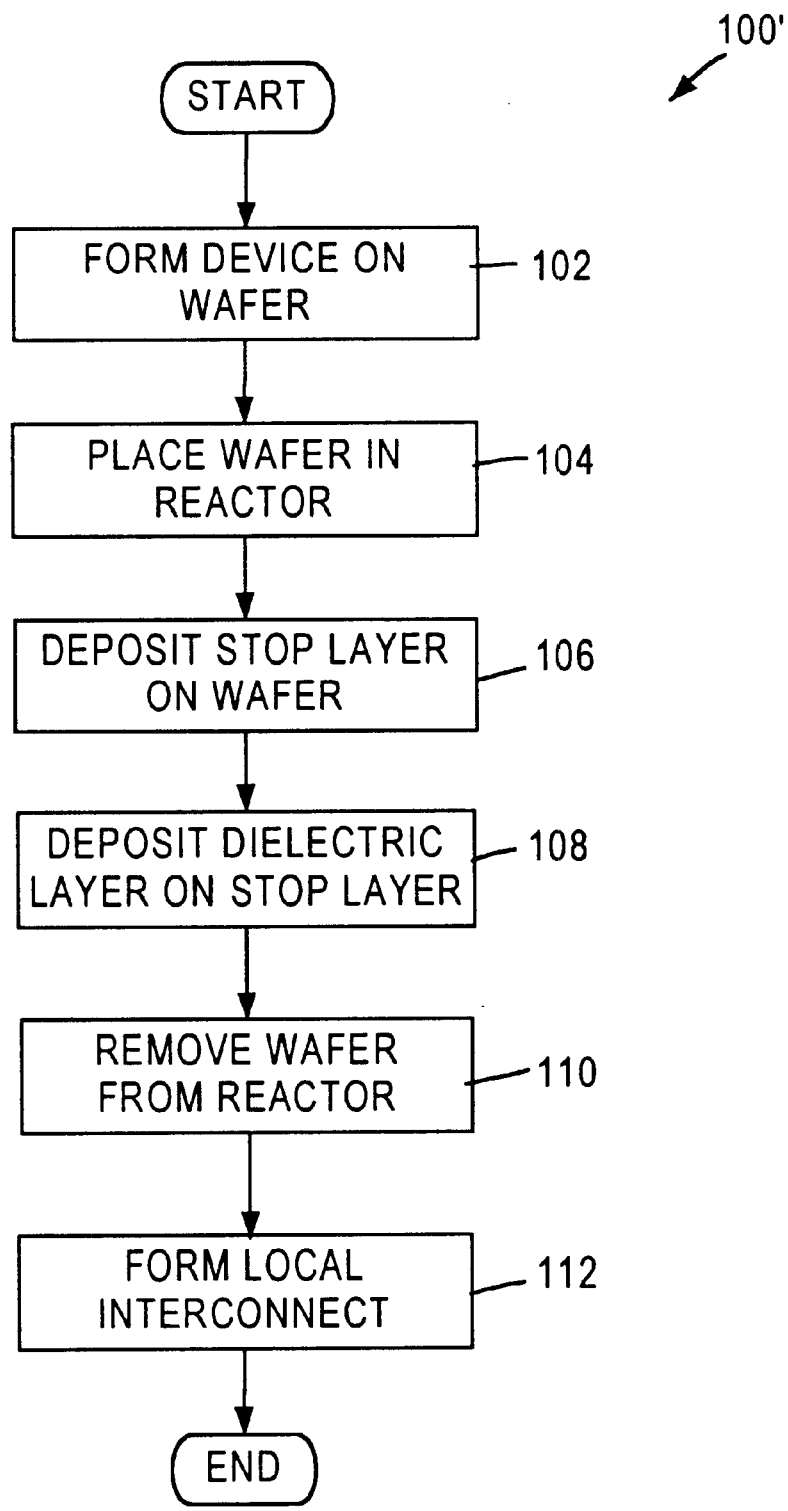
FIG. 2b depicts a flow-chart of an in situ method for depositing a stop layer and an overlying dielectric layer, in accordance with one embodiment of the present invention.

FIG. 2*b* depicts a flow chart of a method 100' for forming a local interconnect, such as the local interconnect 11 of FIG. 1, using an in situ deposition process in accordance with one embodiment of the present invention. Method 100' includes forming devices on a semiconductor wafer, in step 102, using conventional semiconductor device fabrication processes. By way of example, portion 10 of FIG. 1 without stop layer 21 and dielectric layer 19 represents an exemplary wafer having such devices. In step 104, the wafer is placed in a CVD or a like deposition system. Next, in step 106, a stop layer 21 comprising SiC is deposited on the wafer. This is followed by an in situ deposition of a dielectric layer 19, for example TEOS oxide, in step 108. The wafer remains in the deposition system's reactor chamber during steps 106 and 108, and the pressure within the reactor chamber is kept significantly low (e.g. sub-ambient) during these steps.

In accordance with another embodiment that includes a multiple wafer handling system, once a wafer has been processed per step 106, the wafer can be temporarily held in a so called load lock (or similar apparatus) under low pressure until such time as step 108 begins and the wafer is placed back in the reactor chamber. In step 110, the wafer is removed from the reactor. The wafer is then processed, in step 112, to form at least one local interconnect using conventional damascene techniques. Thus, for example, portion 10 of FIG. 1 depicts an exemplary local interconnect formed as a result of step 112.

The methods and arrangements of the present invention advantageously take advantage of conventional fabrication processes including, for example, implantation, deposition, etching, and/or CMP processes. The methods and arrangements in accordance with the principles of the present invention are fully adaptable to different semiconductor devices having different materials and/or critical dimensions.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A semiconductor device comprising:

a substrate having a main surface;

a field dielectric region isolating an active region;

a transistor formed in the active region, the transistor comprising:

a first gate electrode on the main surface of the substrate with a gate dielectric layer therebetween; and source/drain regions in the substrate with a channel region therebetween underlying the gate electrode;

a second gate electrode extending on the field dielectric region;

a conformal layer of silicon carbide (SiC) over the transistor, second gate electrode and field dielectric region;

an inter-dielectric layer on the SiC layer;

an opening formed in the inter-dielectric layer and SiC layer exposing a portion of a source/drain region, field oxide region and second gate electrode; and conductive material filling the opening and forming a local interconnect between the source/drain region of the transistor and second gate electrode.

2. The semiconductor device of claim 1, further comprising:

dielectric sidewall spacers on side surfaces of the first transistor;

the SiC layer on the dielectric sidewall spacers; and the source/drain regions comprising shallow extensions.

3. The semiconductor device of claim 1, wherein the inter-dielectric layer comprises silicon oxide.

4. The semiconductor device of claim 3, wherein the SiC layer has a dielectric constant of less than about 3.2.

5. The semiconductor device of claim 4, wherein the composite dielectric constant between the first gate electrode and the local interconnect is between about 3.7 to about 4.7.

6. The semiconductor device of claim 1, wherein the SiC layer has a thickness of about 500 Å to about 1000 Å.

7. The semiconductor device of claim 1, wherein the conductive material comprises tungsten or copper.

* * * * *